(12) United States Patent
Banerjee et al.

(10) Patent No.: US 8,188,460 B2
(45) Date of Patent: May 29, 2012

(54) BI-LAYER PSEUDO-SPIN FIELD-EFFECT TRANSISTOR

(75) Inventors: Sanjay K. Banerjee, Austin, TX (US);
Leonard Franklin Register, II, Round Rock, TX (US); Allan MacDonald, Austin, TX (US); Dharmendar Reddy Palle, Austin, TX (US); Emanuel Tutuc, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 288 days.

(21) Appl. No.: 12/624,481

(22) Filed: Nov. 24, 2009

(65) Prior Publication Data

US 2010/0127243 A1    May 27, 2010

Related U.S. Application Data

(60) Provisional application No. 61/118,251, filed on Nov. 26, 2008.

(51) Int. Cl.
*H01L 29/06* (2006.01)
(52) U.S. Cl. .............................. 257/39; 257/36; 438/158
(58) Field of Classification Search .................... 257/36, 257/37, 38, 39, 347, 365, E29.255; 438/158
See application file for complete search history.

(56) References Cited

U.S. PATENT DOCUMENTS

| | | | | |
|---|---|---|---|---|
| 3,643,237 | A * | 2/1972 | Anacker | 365/160 |
| 6,294,813 | B1 * | 9/2001 | Forbes et al. | 257/321 |
| 6,525,379 | B2 * | 2/2003 | Nomoto et al. | 257/347 |
| 6,914,292 | B2 * | 7/2005 | Specht et al. | 257/321 |
| 7,029,994 | B2 * | 4/2006 | Ge et al. | 438/479 |
| 2005/0205969 | A1 * | 9/2005 | Ono et al. | 257/645 |
| 2009/0140801 | A1 * | 6/2009 | Ozyilmaz et al. | 327/581 |

* cited by examiner

*Primary Examiner* — Phuc Dang
(74) *Attorney, Agent, or Firm* — Antony P. Ng; Yudell Isidor Ng Russell PLLC

(57) ABSTRACT

A bi-layer pseudo-spin field-effect transistor (BiSFET) is disclosed. The BiSFET includes a first and second conduction layers separated by a tunnel dielectric. The BiSFET transistor also includes a first gate separated from the first conduction layer by an insulating dielectric layer, and a second gate separated from the second conduction layer by an insulating layer. These conduction layers may be composed of graphene. The voltages applied to the first and/or second gates can control the peak current and associated voltage value for current flow between top and bottom conduction channels, and interlayer current voltage characteristic exhibiting negative differential resistance. BiSFETs may be used to make a variety of logic gates. A clocked power supply scheme may be used to facilitate BiSFET-based logic.

6 Claims, 6 Drawing Sheets

ବି-LAYER PSEUDO-SPIN FIELD-EFFECT TRANSISTOR

PRIORITY CLAIM

The present application claims priority under 35 U.S.C. §119(e)(1) to provisional application No. 61/118,251 filed on Nov. 26, 2008, the contents of which are incorporated herein by reference.

BACKGROUND OF THE INVENTION

1. Technical Field

The present invention relates to field-effect transistors in general, and in particular to bi-layer pseudo-spin field-effect transistors.

2. Description of Related Art

For a field-effect transistor (FET), a gate typically controls electrical current that flows between a source and a drain. In a metal-oxide semiconductor field-effect transistor (MOSFET), gate control is achieved by regulating the height of a conduction channel in energy below threshold or through self consistent electrostatics and the number of charge carriers within the conduction channel above a threshold, with the threshold being the point of switching between an ON state and an OFF state of the MOSFET. For a short-channel (i.e., a few tens of nanometers channel length) FET, the injection efficiency of charge carriers into a conduction channel above the threshold is approaching the ideal of unity; only backscattering of some of the carriers to the source due to channel-to-gate dielectric surface roughness or interaction with the vibrational modes of the semiconductor and/or dielectric within the conduction channel may reduce this injection efficiency by a factor of approximately two or less. Thus, the ON state current of a short-channel FET can be quite large.

The switching between the ON and OFF states of a FET is not entirely abrupt. At best, in a limit that can only be closely approached below threshold, the current can be reduced only by one order of magnitude for every 2.3 $k_B T/q$, where $k_B$ is the Boltzmann's constant, T is the temperature in degrees Kelvin, and q is the magnitude of the charge of an electron, with $k_B T/q$ being approximately 60 mV at room temperature (i.e., 300° K). This limit is a result of thermionic emission into the channel of energetic charge carriers from the high energy tail of the carrier energy distribution in the source. The thermionically-emitted charge carriers represent a critical leakage path for a FET in the OFF state. Thermionic emission is a basic physical mechanism of transport in a FET and cannot be eliminated by changing conduction channel materials or by providing better gate control over the channel barrier height. Even if a FET can be built atom-by-atom exactly as desired, this 2.3 $k_B T/q$ per decade (i.e., factor of 10) change in current flow below threshold would still represent the best switching behavior possible for the FET.

Complementary-metal oxide semiconductor (CMOS) logic circuits are designed such that in any logic state under steady-state conditions, there is always one OFF-state transistor connected in series between a supply voltage and ground, so that only OFF-state leakage currents flow under steady-state conditions. Large currents flow only during switching transients in order to charge the gates of subsequent transistors and interconnects quickly. However, in order to minimize power consumption in a CMOS logic circuit in which transistors only switch for a very small fraction of the time on average, transistor ON-OFF current ratios of multiple orders of magnitude (multiple factors of ten) must be achieved for controlling OFF-state power consumption. In order to achieve these ratios subject to the optimal 2.3 $k_B T/q$ per decade switching criteria and to provide enough ON-state current to perform switching, an approximately half a Volt change in the gate voltage between the ON and OFF states will be required under normal operating conditions. A lower limit should be reached somewhere around the end of the next decade.

The actual voltage change possible in CMOS circuits is defined by the power supply voltage. However, the energy consumed during switching increases according to the square of the supply voltage. Thus, as device density increases in logic circuits, not only device dimensions have been reduced, supply voltages have also been reduced. The inability to further scale supply voltages beyond this point represents a major hurdle to the continued improvement in speed and energy efficiency of future logic circuits that employ MOSFETs.

Consequently, it would be desirable to provide a new type of transistor.

SUMMARY OF THE INVENTION

In accordance with a preferred embodiment of the present invention, a bi-layer pseudo-spin field-effect transistor (BiSFET) includes a first layer and a second layer separated by a tunnel dielectric. The first and second gates are separated from the corresponding conduction layers by insulating dielectrics. The BiSFET is intended to function with very low gate and interlayer biases.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

I. Introduction

The present invention is a new type of transistor capable of consuming less power than conventional field-effect transistors (FETs). The new type of transistors, which can be called bi-layer pseudo-spin FETs (BiSFETs), are based on the concept of pseudo-spin in semiconductor bi-layers (or two quantum wells separated by a tunnel barrier), and the carriers in the bi-layers are controlled via two electrical gates. Pseudo-spin is a concept analogous to the quantum mechanical "spin" of an electron. Instead of an electron having spin "up" or "down" degree of freedom, pseudo-spin refers to the "which layer" degree of freedom.

II. Bi-Layer Pseudo-Spin Field Effect Transistor

Figure 1:
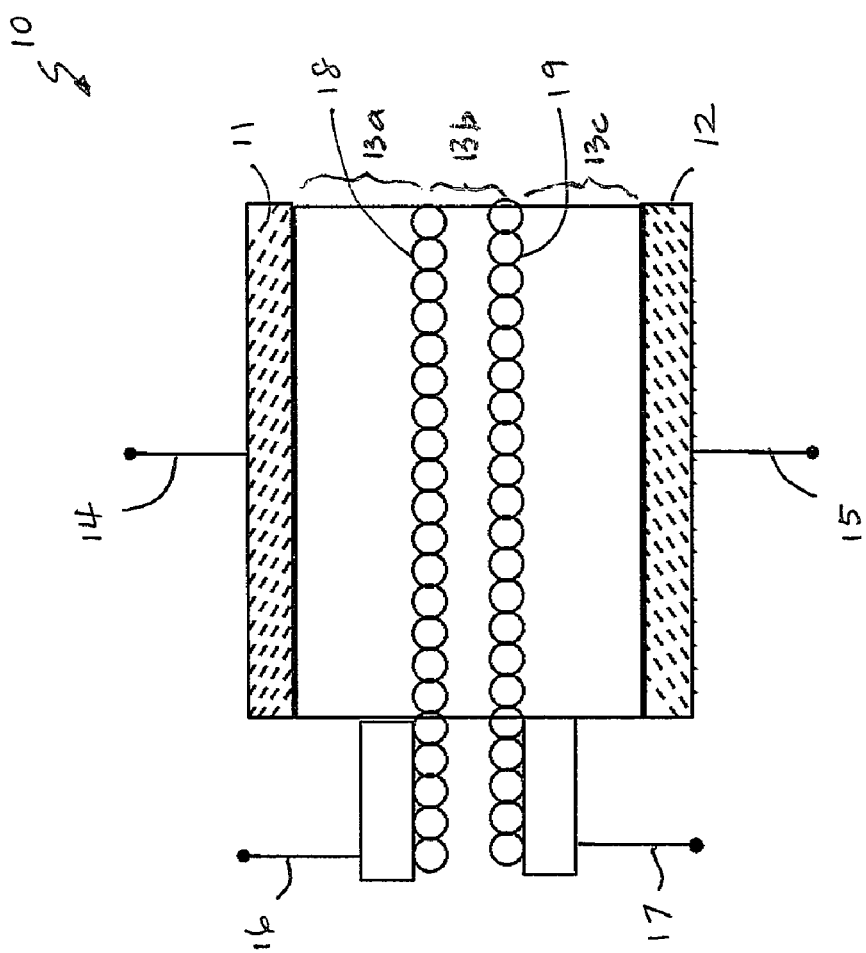
FIG. 1 is a diagram of a bi-layer pseudo-spin field-effect transistor, in accordance with a preferred embodiment of the present invention.

Referring now to the drawings, and in particular to FIG. 1, there is depicted a diagram of a BiSFET, in accordance with a preferred embodiment of the present invention. As shown, a BiSFET 10 includes dielectric layers 13a, 13b and 13c formed between a first gate 11 and a second gate 12. A first conduction layer 18 and a second conduction layer 19 are formed within dielectric layers 13a-13c. Specifically, first conduction layer 18 is separated from second conduction layer 19 by dielectric layer (a tunnel dielectric) 13b. First gate 11 is separated from first conduction layer 18 by dielectric layer (an insulating dielectric) 13a. Similarly, second gate 12 is separated from second conduction layer 19 by dielectric layer (an insulating dielectric) 13c. Dielectric 13b can be formed of different composition than dielectric layers 13a and 13c.

BiSFET 10 has four terminals, namely, a first gate contact 14, a second gate contact 15, a first conduction layer contact 16, and a second conduction layer contact 17. First gate contact 14 is connected to first gate 11, and second gate contact 15 is connected to second gate 12. First conduction layer contact 16 is connected to first conduction layer 18, and second conduction layer contact 17 is connected to second conduction layer 19.

Preferably, first and second conduction layers 18, 19 (bi-layers) are made of graphene. First and second conduction layers 18, 19 are separated by a dielectric tunnel barrier, such as silicon dioxide ($SiO_2$) or simply air with perhaps different insulating dielectrics. Graphene is defined as monoatomic sheets of graphite or hexagonally ordered carbon atoms, which can be thought of as unrolled carbon nanotubes.

Graphene is particularly attractive for BiSFETs because of its unique band structure and the very high Fermi energy (which depends on carrier energy) for a given carrier (electron or hole) density. Unlike the typical parabolic band structure or energy versus momentum relationship in most semiconductors, graphene is a semi-metal having a linear band structure. The conduction and valence bands meet at what is known as the Dirac (crossing) point at the K point in the Brillouin zone. This is also the point of charge neutrality with respect to electron filling of the graphene band structure. The symmetric linear band structure of graphene near the Dirac point provides an attractive platform for generating electron-hole bi-layers.

The graphene layers can be occupied by either negatively charged electrons above the Dirac point, or by holes associated with missing electrons below the Dirac point that act as positively charged carriers. The charge density in the graphene layers can be, for example, electrostatically modulated by gates separated from the graphene layers by the gate dielectrics, similar to complementary-metal oxide semiconductor (CMOS) structures. A positive gate bias can induce electrons in one graphene layer, and a negative gate bias will induce holes in the other. This can lead to formation of "excitons" or bound electron-hole pairs between the first and second graphene layers due to Coulomb attraction between electrons and holes.

III. Device Fabrication

Initially, second gate 12 is formed in a n$^+$ or p$^+$ silicon (or suitable refractory metal gate with the right work function) of a patterned silicon wafer. A gate dielectric (dielectric layer 13c) is then deposited on top of second gate 12 via physical or chemical vapor deposition of silicon dioxide, $HFO_2$, $ZrO_2$ or high-k. This is followed by second conduction (graphene) layer 19 deposition. Currently, one possible way of doing so is by mechanical exfoliation, but the flakes are small and positioning them on a wafer is not easy. Epitaxial graphene growth, perhaps via seeded chemical deposition, on full wafers would be more appropriate and may be possible.

Subsequently, second conduction (graphene) layer 19 is patterned and etched as to be contacted by second conduction layer contact 17. Next, second conduction layer contact 17 is formed by lithographically patterning using a suitable metal for ohmic contact formation to graphene. The tunnel dielectric (dielectric layer 13b), or a sacrificial layer to be later removed, leaving air, is deposited, and first conduction (graphene) layer 18 is formed on top of the tunnel dielectric. First conduction (graphene) layer 18 is patterned and etched so that it is laterally slightly offset from second conduction layer 19, though there is an overlap in the region where pseudo-spin effects will be used. A top gate dielectric is formed, and first gate 11 is deposited and patterned. First gate contact 14 and first conduction layer contact 16 may be formed with suitable metallization. First and second conduction layer contacts 16, 17 are located on the same side of BiSFET 20 to enable the electron-hole tunneling current to be injected and extracted effectively. The contact hole to first conduction layer 18 is formed in the non-overlapping part so as to not short out second conduction layer 19.

IV. Device Theory

Figure 2:
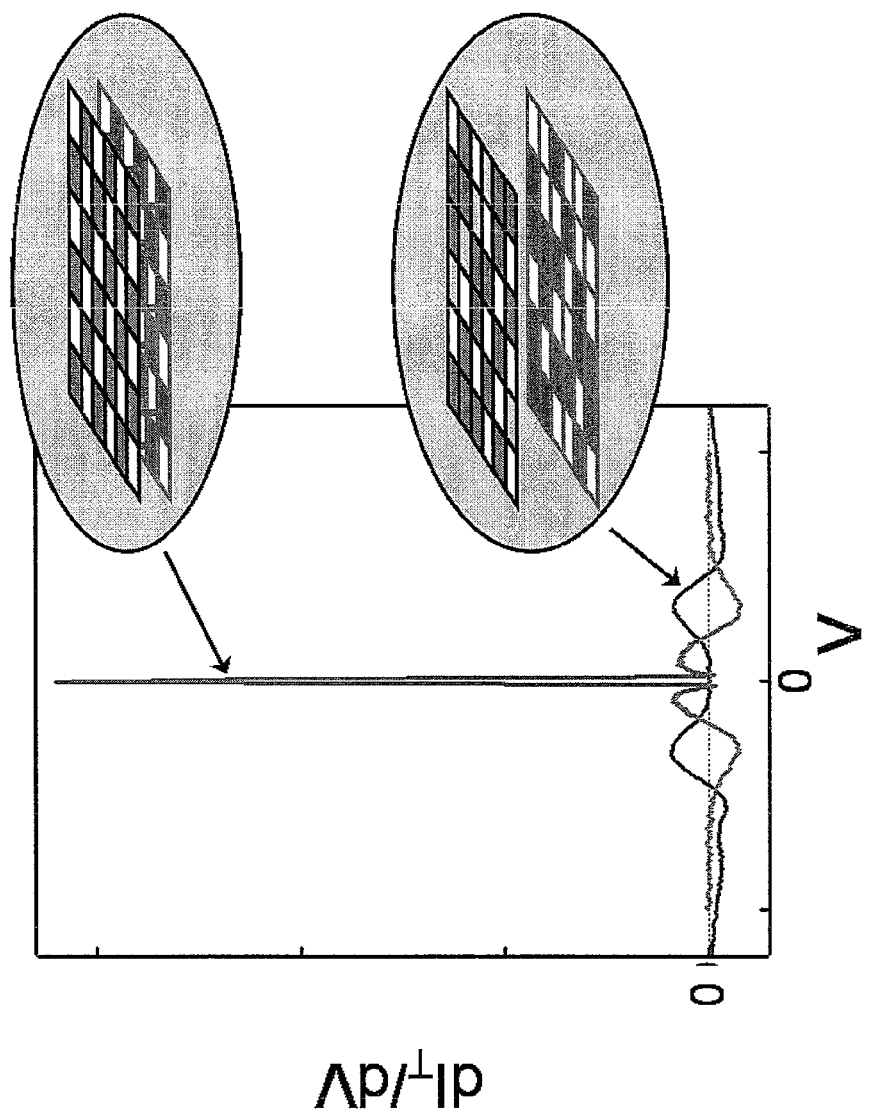
FIG. 2 is a graph illustrating experimental interlayer tunneling versus interlayer voltage in two bi-layer electron systems under high magnetic fields.

BiSFET 10 is based on the electrical properties of semiconductor bi-layers with exciton-condensation (also known as interlayer phase coherence), and an associated low interlayer bias enhanced interlayer tunneling current, as illustrated in FIG. 2. This ordered many-body electronic state has only been realized in GaAs/AlGaAs multilayer systems and in the low-temperature high-magnetic field quantum-Hall regime. However, it has been theoretically shown that condensate can occur at much higher temperatures, possibly above room temperature, in a system composed of an n-type and p-type graphene layer having large and nearly equal carrier densities, separated by $SiO_2$ or another dielectric tunnel barrier. Nearly perfect electron-hole symmetry in the band structure is critical to condensate formation. It is expected that this condensate may form in graphene bi-layers at and below temperatures of approximately one-tenth $E_F/k_B$, where $E_F$ is the magnitude of the Fermi energy relative to the band edge.

At a low bias, the enhanced tunneling currents is expected to be limited only by contact resistances, even when the bare single-particle interlayer tunneling current (which is characterized below by the resonant symmetric-antisymmetric state splitting $\Delta_0$) is extremely small. Spontaneous interlayer coherence means that electrons occupy both layers simultaneously which, in effect, eliminates the interlayer tunneling resistance. With contacts to the same ends of the two graphene sheets, this current is expected to flow between layers within approximately a Josephson length $\lambda_j$ estimated to be $$\lambda_j = \frac{1}{k_F}\left(\frac{\rho_s}{\Delta_o}\right)^{\frac{1}{2}} \quad (1)$$

where $\rho_s$ is the superfluid density, which is estimated to be one-tenth of the Fermi energy $E_F$ in the regime of interest.

However, there is a maximum current density per unit width of the graphene sheets that can flow, of perhaps $$I_{max} = \frac{2\pi e}{h} \frac{\rho_s}{\lambda_j} \quad (2)$$

at a corresponding voltage of $$V_{max} = \frac{I_{max}}{G} \quad (3)$$

where h is the Planck's constant and G is the contact conductance per unit width. In the Landauer-Büttiker quantum limit, $$G = 4 \frac{e^2}{\lambda} \frac{k_F}{\pi} \quad (4)$$

considering both (actual) spin states and both equivalent energy valleys, and $k_F = E_F/hv$ in graphene, where v is the constant carrier velocity magnitude, determines the density per unit width of occupied/conducting subbands. When interlayer voltage V exceeds $V_{max}$, the interlayer phase and the local carrier densities are expected to become time-dependent. At present, little is known with certainty about the time-averaged current-voltage relationship in this regime. However, time-dependence that induces deviations from the favored conditions will tend to destroy the many-body enhanced currents. As for the condensate formation, this tendency should be even stronger in graphene bi-layers. It is expected that in the case of graphene bi-layers, the time averaged current will quickly drop to small values when $V_{max}$ has been exceeded as it does for the quantum well bilayer system of FIG. 2, which produces a negative differential resistance (NDR) region.

Furthermore, a sufficient imbalance in the magnitudes of the charge densities is expected to degrade $I_{max}$ by leaving unpaired carriers to degrade the condensate, which effectively reduces $\rho_s$. In this strong coupling regime, the effect is likely somewhat robust, so that complete destruction of the condensate may require somewhat large charge imbalances. However, significant condensate, and thus, $I_{max}$ degradation could still be achieved with smaller charge imbalances, $2(p-n)/(p+n)$, of perhaps ten percent.

It may be possible for electronics to exploit this greatly enhanced but low-bias-only interlayer tunneling in order to produce low-voltage switching and logic. It appears that $V_{max}$ can be quite small even compared to $k_BT$. Again, this electron-hole correlation in the two layers is best achieved for large and equal electron (one layer) and hole (other layer) charge densities. Using appropriate gate materials (dual work functions), ferroelectric gate dielectrics, modulation doping, and/or perhaps fixed back-gate biases, it may be possible to obtain sufficiently large equal magnitude electron and hole densities with the required near-zero interlayer bias, and for zero gate bias with the possible exception of that use of a "back" gate bias. Small applied gate voltages can then be used to create charge imbalances between layers to manipulate $I_{max}$. However, this behavior is quite different from FETs where the higher the drain bias, the higher the drain current, until it saturates (leading to a high differential output impedance $dV_D/dI_D$). In a FET, below threshold, the gate alone must control the current flow for switching subject to limits of single-particle thermionic emission. Thus, any logic circuits employing BiSFETs should vary significantly from their CMOS counterparts.

As noted previously, large, opposite and equal or nearly equal charge distributions as desired in first and second conduction layers 18, 19 within the region where the enhanced tunneling is to occur, and under zero bias to contacts 14-17. Such large equal or nearly equal zero-bias charge densities could be produced by, for example, using dual gate work function gates. However, dual work functions will add to process complexity. Alternatively, one may also be able to work with the same gate electrode materials on either side of the bilayer, and use a fixed (unswitched) backgate bias on one to achieve the large opposite carrier densities, while using only small voltages on the reaming switched gate to achieve the desired functionality. The usage of ferroelectric gate dielectric may also achieve the required layer charge densities. The usage of remote (modulation) doping is another possibility. The region for interlayer tunneling (condensate formation) could be defined by multiple mechanisms, including but not limited to a reduction in the interlayer spacing, reduction in dielectric permittivity of the insulating layer 13b, such as by replacing an interlayer dielectric of $SiO_2$ or higher dielectric permittivity material with an air gap, or simply localization of near electron-hole charge balance to this region, such as might naturally occur with the localization of the gates and their associated work functions. The key switching operations to change BiSFET 10 from conducting to non-conducting will involve first applying small biases to one or more gates to unbalance or rebalance the charge distribution and, thus, reduce or maximize, respectively, $I_{max}$ and $V_{max}$. This will be followed by a ramping of the interlayer voltage $V_{TL}-V_{BL}$ for at least two devices in series until the voltage across one exceeds its gate-defined $V_{max}$ driving that device into the NDR region and shutting it off and producing a high impedance with further (but still small) increases in the interlayer voltage. The associated logic may require multiple clocked power supplies.

V. Pseudospintronics

For electronics based on pseudo-spin or pseudospintronics, one can exploit this many-body, correlated carrier phenomenon where the electrons in one layer are correlated with holes in the other due to Coulombic interactions, leading to enhanced many-body (as opposed to single particle) tunneling rates from the filled (electron) states to the empty (hole) states at very low interlayer biases close to zero. This electron-hole correlation in the two layers is best achieved for equal and large densities of electrons in one layer and holes in the other. Such charge densities could be achieved with the appropriate biases on the two gates. However, as outlined above, by using dual work function gates, ferroelectric gate or interlayer dielectrics, backgating, and/or remote doping, or perhaps yet other means, it may be possible to induce the large equal, or nearly equal, as desired, charge densities under zero gate bias. This would allow use of low gate biases as desirable for a low voltage, low power logic circuitry scheme. For such a charge balanced electron-hole bilayer system, a high differential tunnel conductance peak should be achievable at zero interlayer bias $V_{TL}-V_{BL}$. As the interlayer bias is increased, for either polarity, this electron-hole correlated, many-body tunneling behavior is destroyed producing a negative differential resistance (NDR) and the current drops rapidly to a low, OFF-state leakage current. For logic, one needs a three-terminal device, where a gate can modulate the device characteristics. In the BiSFET, one can also reduce the peak interlayer tunneling current somewhat by small changes of one or both of the two gate biases to induce a small electron-hole charge imbalance between the two layer, or to rebalance the charge and, thus, achieve gate control.

Figure 3:
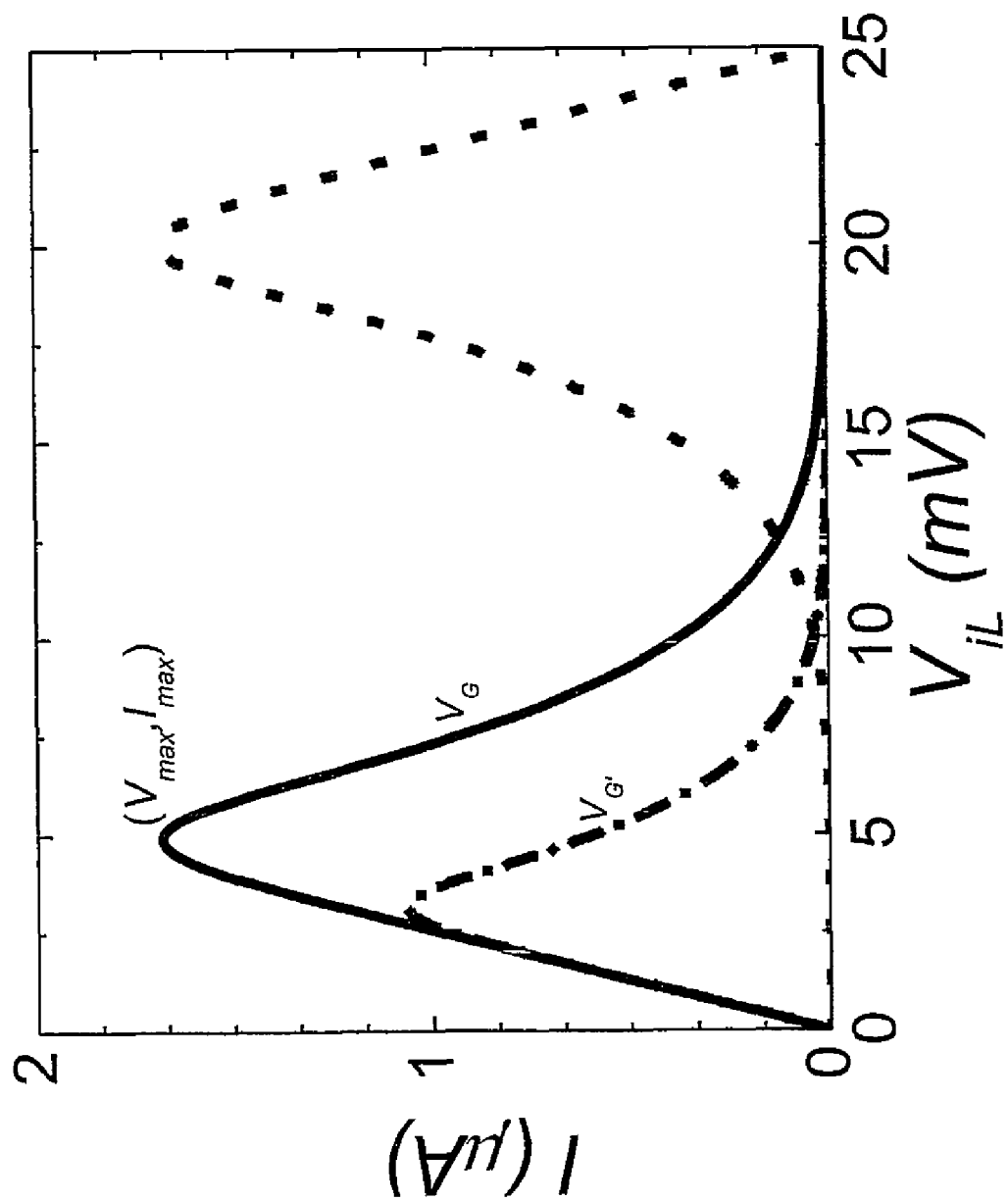
FIG. 3 is a graph illustrating qualitatively predicted I-V behavior of BiSFETs under differing gate bias and location within a two-BiSFET inverter.

It is important to emphasize the rather unique current-voltage characteristics of a BiSFET, and its differences from FETs, in order to appreciate their applications in Boolean logic such as inverters and NAND/NOR gates. The BiSFET interlayer tunneling current as a function of interlayer voltage characteristic has a somewhat step-like discontinuity near zero interlayer bias, and NDR for either polarity of interlayer bias, such that the interlayer tunneling current goes to a low OFF state current at higher interlayer biases, as illustrated in FIG. 3. Hence, the interlayer current-voltage behavior is such that it acts essentially as a short circuit for interlayer biases near zero, and an open circuit with a much higher output impedance for higher interlayer biases. This is quite different from FETs where higher the drain bias, higher the drain current, until it saturates. In that sense, BiSFETs are more reminiscent of Josephson Junctions and superconducting quantum interference devices than FETs. BiSFETs show a bi-stable behavior that is very different from FETs.

Also, as mentioned previously, the interlayer tunneling currents can be, if not eliminated, then at least reduced slightly (by, for example, a factor of two) by small changes of gate biases (tens of mV) to drive the bilayer into an electron-hole charge imbalance, or increased slightly by using the gates to balance an initially slightly unequal charge distribution. With devices wired in series, this forces the more unbalanced device (subject to details of output loads and device geometry) to first reach the NDR region and develop a high inter-layer voltage and thus get into the high impedance state, as shown in FIG. 3. The difference of this type of gating action with FETs should be noted. In a FET, small changes of the gate bias must produce a large change of the output drain current in accordance with the subthreshold slope for proper switching action. In a BiSFET, the gate does not need that level of control because it is the interlayer bias that predominately serves to shut off the more unbalanced device. The key advantage of BiSFET-based logic is that since the logic voltage swings are much lower than in CMOS, BiSFET-based logic should consume much less power overall than its CMOS counterpart.

VI. Boolean Logic Gates Using Bisfets a. Inverter

Figure 4:
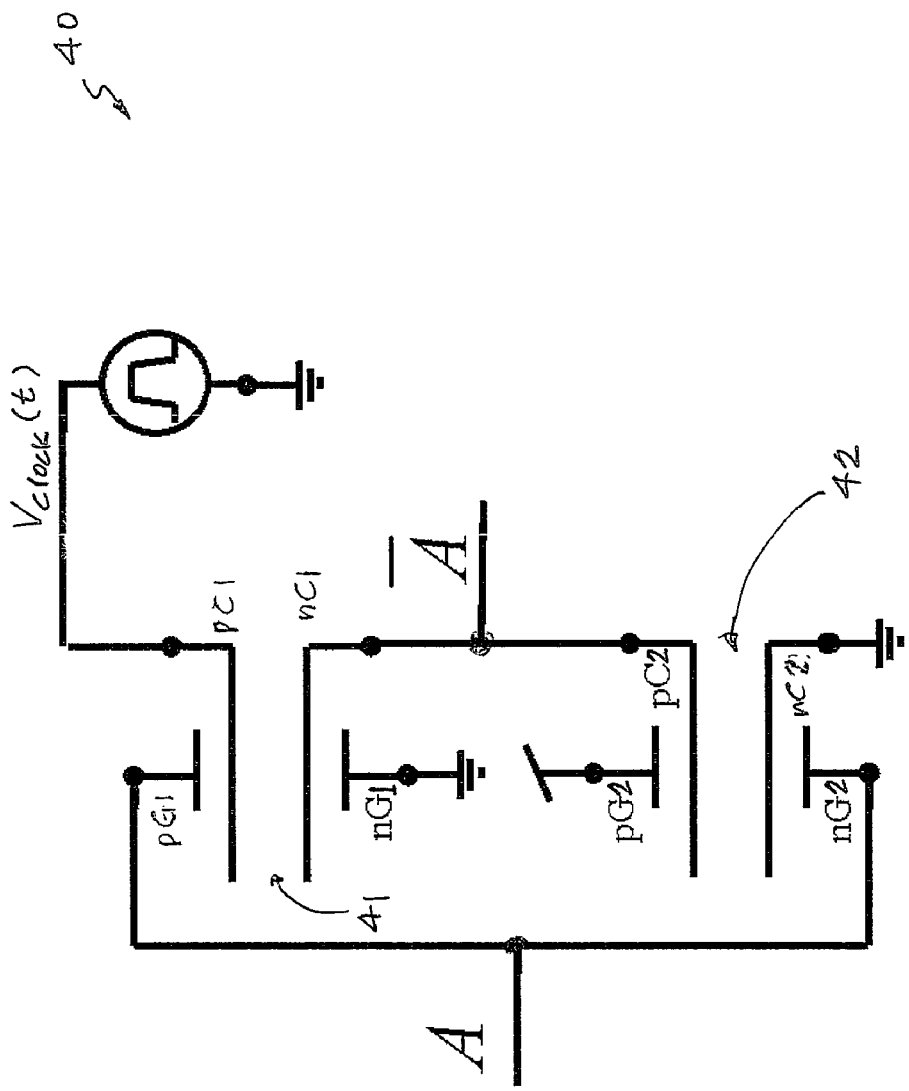
FIG. 4 is a circuit diagram of an inverter employing bi-layer pseudo-spin field-effect transistors, in accordance with a preferred embodiment of the present invention.

One of the simplest logic gates is an inverter. As shown in FIG. 4, at inverter 40 is made in a complementary geometry using two BiSFETs 41, 42, with BiSFET 41 as a driver and BiSFET 42 as a load. The input of inverter 40 is connected to a gate pG1 of BiSFET 41 and a gate nG2 of BiSFET 42. The output of inverter 40 is connected to a conduction layer nC1 of BiSFET 41 and a conduction layer pC2 of BiSFET 42. A conduction layer pC1 of BiSFET 41 is connected to a clock, and a conduction layer nC2 of BiSFET 42 is connected to ground.

Graphene conduction layers (i.e., pC1, nC1, pC2 and nC2) for BiSFETs 41, 42 are interconnected in a fashion that either BiSFET 41 will be ON and BiSFET 42 OFF, or vice versa when the input is changed. Either BiSFET 41 or BiSFET 42 with balanced concentration of electrons and holes in the two conduction layers with equal and opposite effective gate bias (overdrives) after accounting for gate work function differences, and low interlayer bias is shorted, while the one with unbalanced charged distribution is open.

Also as mentioned previously, the BiSFET with the unbalanced charge densities, induced by the appropriate asymmetry of gate biases, will have at least a slightly lower current, and will move along the NDR for the lower I-V curve, as shown in FIG. 3. It will develop a higher interlayer bias in the negative differential resistance region and will get into the high impedance state as the power supply voltage is then ramped up, in accordance with the load line in FIG. 3. For a FET, switching depends on a large modulation of the output current with a small change of the input gate bias in accordance with the subthreshold slope. For a BiSFET, switching depends both on the gate bias and the interlayer voltage.

The load line also gives guidance about the choice of the power supply. Because of the unique I-V characteristics of the BiSFET, with its NDR and perhaps limited gate control over the peak interlayer current, use of a DC power supply may not work. If the current cannot be completely shut off with the desired small changes gate input voltage alone, once one of BiSFETs 41, 42 gets locked into a high impedance state with a fixed power supply voltage, it cannot get out of it, regardless of the input voltage. Hence, a time varying supply voltage, such as but not limited to a trapezoidal voltage pulse, should be used in this case, which lags the input voltage slightly. That ensures that the interlayer bias for both the driver and load device is initially small. They will then follow the high current or the low current trajectory in the load line, depending on whether the bilayer is in a balanced or unbalanced interlayer charge state, which will depend on whether the input is high or low. The load line also provides guidance about the optimal power supply. It must be low (e.g, in the tens of mV) range to ensure that the active switching power, or at least that related to charging of the load and parasitic capacitances C, $CV^2f$, where f is the clock frequency, is low, but also be large enough such that the leakage current in OFF device is sufficiently low. However, because inverter 40 need not remain powered after it has passed on its output with this clocked power supply scheme, the ON/OFF ratio need not be as large as for MOSFETs in CMOS logic circuits. It also means that a logic gate can begin processing new data while subsequent gates are still working with old data; the initial gate need not hold its output until the last gate in a sequence passes its output to a latch or some form other form of temporary data storage device.

It should be noted, however, that with the output load gates of subsequent device and interconnects, current flow through BiSFET 41 increases relative to that of the lower one 42 during the onset of switching, effectively decreasing its $I_{max}$ relative to that of the lower device. An increase in the average terminal voltage $(V_{TL}+V_{BL})/2$, larger for BiSFET 41 even if still small at the critical switching point, also produces some charge imbalance and tends to produce an actual relative reduction in $I_{max}$ the upper device even with otherwise optimal gate voltages. These effects complicate the analysis and define limits on fan-out. But, compensating adjustments can be made as necessary via changes in the relative gate widths of the devices and/or adjustments of the fixed gate input voltages (work functions) from what would otherwise be required.

b. Signal Follower

A signal follower—output equals input—can be manufactured by simply reversing the fixed (effective) gate voltages between BiSFETs 41 and 42 for inverter 40 of FIG. 4. Such a gate would be useful for increasing the fan-out, and synchronizing output signals among multiple gates with clocked power-supplies.

c. NOR Gate

Figure 5:
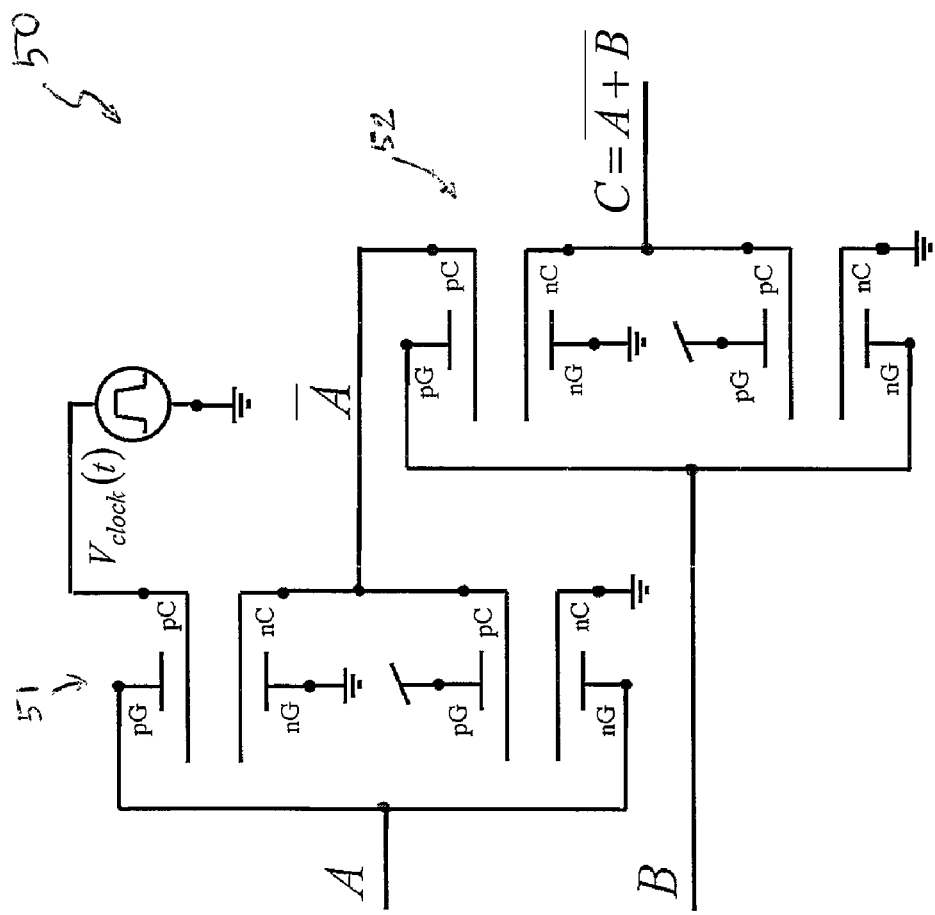
FIG. 5 is a circuit diagram of a NOR gate employing bi-layer pseudo-spin field-effect transistors, in accordance with a preferred embodiment of the present invention.

A complementary load two-input NOR gate 50 is shown in FIG. 5. NOR gate 50 is formed by an inverter 51, which is identical to inverter 40 from FIG. 4, cascaded to an inverter 52, which is also identical to inverter 40 from FIG. 4. The output of inverter 51 is connected to a conduction layer of a BiSFET transistor of inverter 52.

d. OR/NAND Gate

Figure 6:
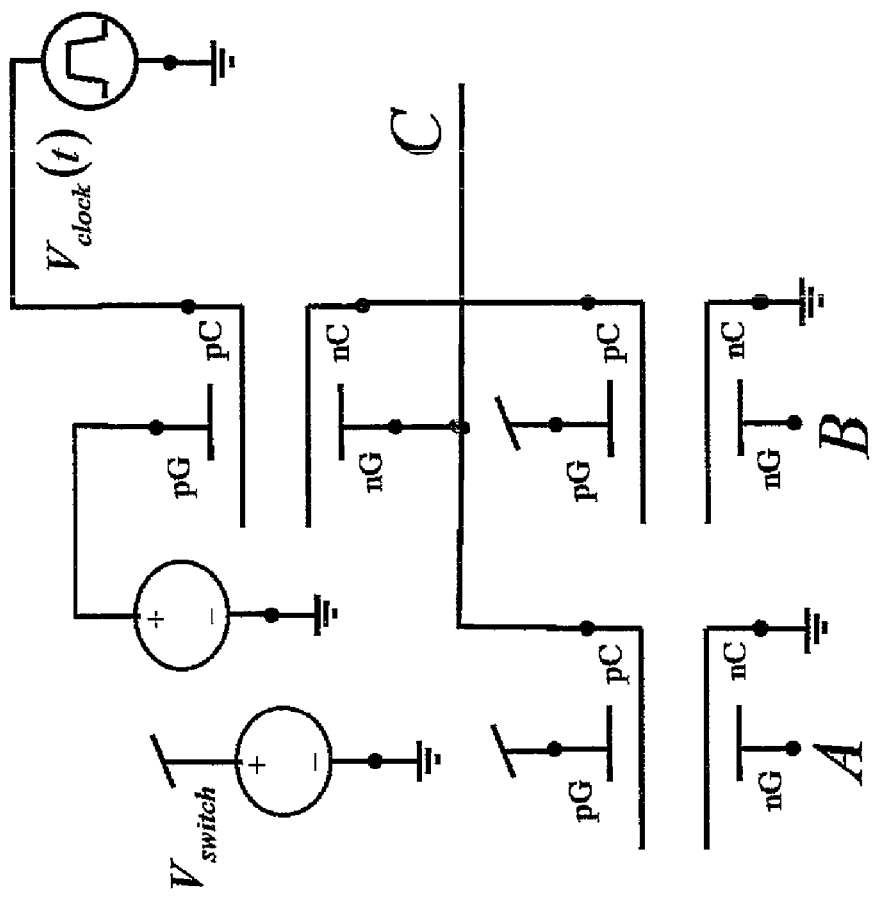
FIG. 6 is a circuit diagram of a OR/NAND gate employing bi-layer pseudo-spin field-effect transistors, in accordance with a preferred embodiment of the present invention.

A complementary load two-input OR/NAND gate 60 is depicted in FIG. 6. With OR/NAND gate 60, output C=A+B when $V_{switch}$=0 mV, and output C=A·B when $V_{switch}$=−25 mV.

As is well known, either a NOR or NAND, along with inverters is enough for any combinatorial logic function. So, in principle, all Boolean logic functions can be implemented by BiSFETs.

It may also be possible to integrate more conventional circuits such as graphene FETs along with BiSFETs. In addition, the interconnections of BiSFETs and graphene FETs may be achievable with metallic graphene interconnects, leading to an all-graphene nanoelectronics platform.

As has been described, the present invention provides a new type of transistor named BiSFET. By providing a mechanism of gate control over the current in the channel that is not subject to thermionic emission, acceptable ON-OFF ratios can potentially be achieved over smaller voltage ranges allowing more energy efficient operation. Furthermore, the associated reduction in power dissipation should then allow for greater device density.

While the invention has been particularly shown and described with reference to a preferred embodiment, it will be understood by those skilled in the art that various changes in form and detail may be made therein without departing from the spirit and scope of the invention.

What is claimed is:

1. A bi-layer pseudo-spin field-effect transistor (BiSFET) comprising:
   a first and second conduction layers separated by a tunnel dielectric layer;
   a first gate separated from said first conduction layer by a first insulating dielectric layer; and
   a second gate separated from said second conduction layer by a second insulating dielectric layer.

2. The BiSFET of claim 1, wherein said tunnel dielectric is high-k.

3. The BiSFET of claim 1, wherein said tunnel dielectric is $SiO_2$.

4. The BiSFET of claim 1, wherein said tunnel dielectric is air.

5. The BiSFET of claim 1, wherein said first and second conduction layers are graphene.

6. A bi-layer pseudo-spin field-effect transistor (BiSFET) comprising:
   a first and second conduction layers separated by a tunnel dielectric layer;
   a first gate separated from said first conduction layer by a first insulating dielectric layer; and
   a second gate separated from said second conduction layer by a second insulating dielectric layer, wherein a peak current and associated voltage for current flow between said first and second conduction layers and an overall current voltage characteristic exhibiting negative differential resistance, are controlled by voltages applied to said first and/or second gates.

\* \* \* \* \*